US011567682B2

(12) United States Patent
Luo et al.

(10) Patent No.: US 11,567,682 B2
(45) Date of Patent: Jan. 31, 2023

(54) TEMPERATURE MANAGEMENT FOR A MEMORY DEVICE USING MEMORY TRIM SETS

(71) Applicant: Micron Technology, Inc., Boise, ID (US)

(72) Inventors: Ting Luo, Santa Clara, CA (US); Ankit Vinod Vashi, Milpitas, CA (US); Xiangang Luo, Fremont, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/685,300

(22) Filed: Nov. 15, 2019

(65) Prior Publication Data
US 2021/0149564 A1 May 20, 2021

(51) Int. Cl.
*G06F 3/06* (2006.01)

(52) U.S. Cl.
CPC ............ *G06F 3/064* (2013.01); *G06F 3/0616* (2013.01); *G06F 3/0652* (2013.01); *G06F 3/0659* (2013.01); *G06F 3/0679* (2013.01)

(58) Field of Classification Search
CPC ...... G06F 3/064; G06F 3/0652; G06F 3/0679; G06F 3/0616; G06F 3/0659; G06F 3/0614; G06F 3/0629; G11C 29/028; G11C 7/04; G11B 33/144
USPC ........ 365/189.011, 185.01, 185.09; 711/103, 711/154; 714/774
See application file for complete search history.

(56) References Cited

U.S. PATENT DOCUMENTS

| 9,368,212 | B1 * | 6/2016 | Pan ................... G11C 29/12005 |
| 9,710,328 | B2 * | 7/2017 | Lee ....................... G06F 11/1048 |
| 2014/0241097 | A1 * | 8/2014 | Hawes ..................... G11C 16/20 365/230.01 |
| 2015/0332780 | A1 * | 11/2015 | Jang .......................... G11C 7/04 365/185.18 |
| 2016/0077753 | A1 * | 3/2016 | Cometti ................ G06F 3/0629 711/103 |
| 2016/0170682 | A1 * | 6/2016 | Bakshi .................. G06F 3/0647 711/103 |
| 2016/0179617 | A1 * | 6/2016 | Lee ...................... G06F 11/1048 714/755 |

(Continued)

*Primary Examiner* — Than Nguyen
(74) *Attorney, Agent, or Firm* — Schwegman Lundberg & Woessner, P.A.

(57) ABSTRACT

Techniques disclosed herein can be used to improve cross-temperature coverage of memory devices and improve memory device reliability in cross-temperature conditions. More specifically, a memory trim set can be selected from multiple candidate memory trim sets when performing a memory operation (such as a memory write operation), based on a temperature metric and a P/E cycle metric for the memory device. The candidate memory trim sets include multiple respective memory trim values (e.g., memory configuration parameters, such as program voltage step size, program pulse width, program verify level, etc., as discussed above) for performing the memory operation. The temperature metric can be indicative of a temperature of at least a region of the memory device (e.g., the entire device, a memory plane, a memory block, etc.), and the P/E cycle metric can be indicative of a number of P/E cycles performed by the memory device within a selected time interval.

18 Claims, 10 Drawing Sheets

(56) References Cited

U.S. PATENT DOCUMENTS

| | | | | |
|---|---|---|---|---|
| 2016/0180959 A1* | 6/2016 | Darragh | ............... | G06F 11/079 |
| | | | | 365/185.09 |
| 2019/0361625 A1* | 11/2019 | Eliash | ................. | G06F 3/0604 |
| 2020/0075120 A1* | 3/2020 | Sheperek | ............. | G11C 29/021 |
| 2020/0133510 A1* | 4/2020 | Koudele | .............. | G06F 3/0614 |

* cited by examiner

TEMPERATURE MANAGEMENT FOR A MEMORY DEVICE USING MEMORY TRIM SETS

Embodiments of the disclosure relate generally to increasing reliability of memory devices and, more specifically, to establishing selected trim levels for write operations in reference to a detected temperature of a memory device or portion thereof. Such embodiments may be implemented, in some examples, in a manner to improve cross-temperature performance of the memory device.

BACKGROUND

Memory devices are typically provided as internal, semiconductor, integrated circuits in computers or other electronic devices. There are many different types of memory, including volatile and non-volatile memory. Volatile memory requires power to maintain its data and includes random-access memory (RAM), in various forms, such as dynamic random-access memory (DRAM), or synchronous dynamic random-access memory (SDRAM), among others. Non-volatile memory may retain stored data when not powered (may be implemented as read-only memory (ROM) in some cases) and may include one or more storage technologies, such as flash memory (e.g., NAND or NOR flash), electrically erasable programmable ROM (EEPROM), static RAM (SRAM), Ferroelectric RAM (FeRAM), erasable programmable ROM (EPROM), resistance variable memory, such as phase-change random-access memory (PCRAM), resistive random-access memory (RRAM), magnetoresistive random-access memory (MRAM), or 3D XPoin™ memory, among others. Systems incorporating memory may include multiple memory devices or memory systems implementing multiple storage technologies.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Memory devices can be configured to operate in different conditions associated with different operating temperatures. For example, data read temperatures (i.e., a temperature of a memory device at time data is read from the device) can be different from data write temperatures (i.e., a temperature of the memory device when data is written to the device). When the data write process includes data being written to a memory device outside of a normal or a preferred temperature range, a cross-temperature condition occurs which is associated with a difference (or delta) between the write temperature and the read temperature, and results in a decrease of the device reliability and inefficient device operation.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
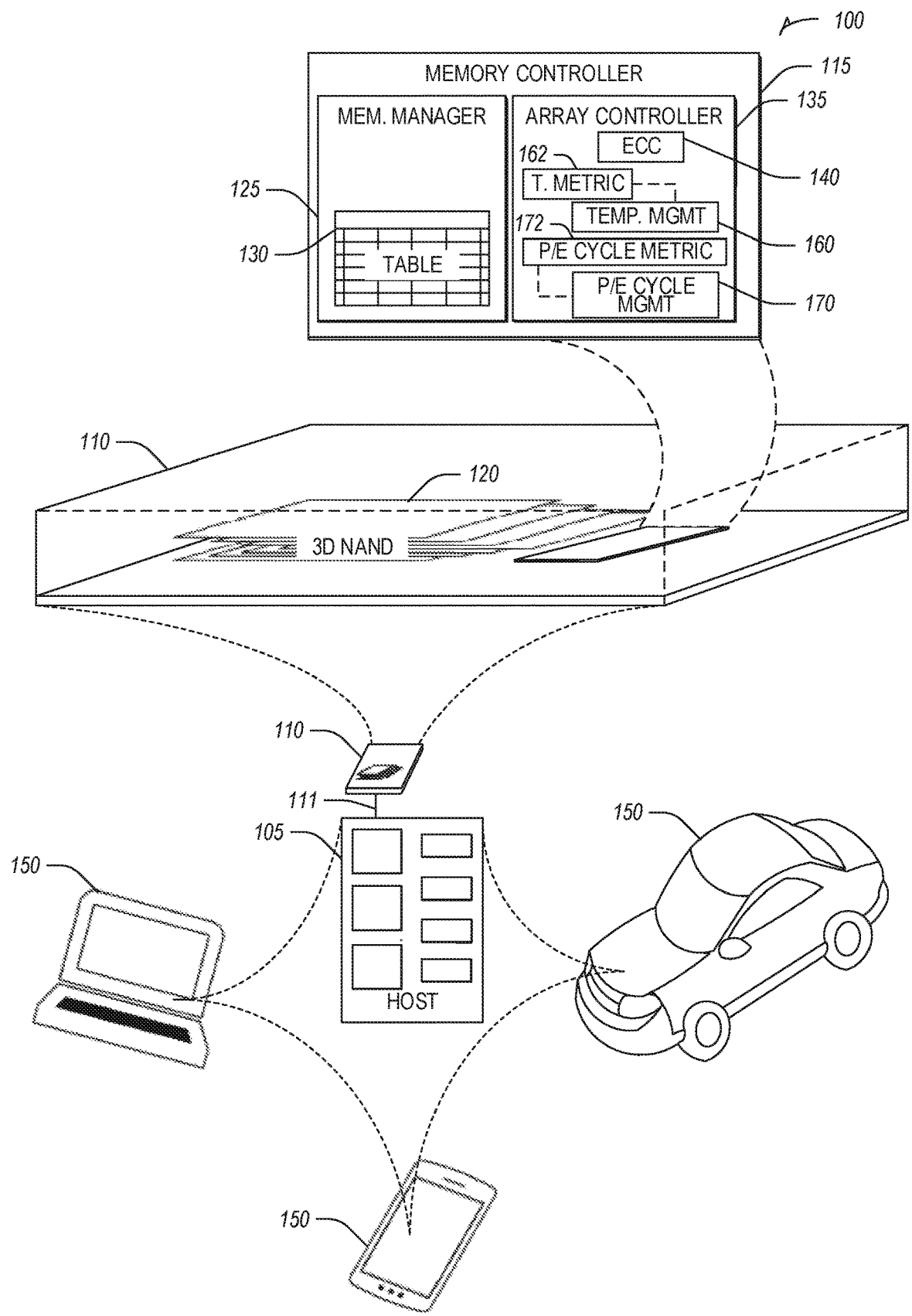
FIG. 1 illustrates an example of an environment including a memory device.

The present document describes examples of memory devices, systems, methods, and machine-readable mediums for improving cross-temperature coverage of devices (e.g., by reducing the effects of cross-temperature conditions, particularly where data is being written to an area outside of a normal or preferred temperature range). In the course of operation of a memory device, data read temperatures can be different from data write temperatures. Most memory device usage results in a write-read temperature difference (or a "temperature delta") that is within an acceptable range (e.g., within a pre-defined range). However, under some operating conditions, the temperature delta can be much wider than the acceptable range associated with the memory device. Under such circumstances, the memory device may fail or may experience unstable operation characteristics, causing reliability concerns.

As used herein, the term "data read temperature" indicates the temperature associated with (i.e., measured at) the memory device (for example, at one or more components of the memory device, or in a specified region within an individual memory die of the memory device), when a data read operation is performed. Similarly, the term "data write temperature" indicates the temperature associated with (i.e., measured at) the memory device, or a component thereof or at a region of an individual memory die, when a data write operation is performed. A difference between a data read temperature of a memory device (or portion thereof) and a data write temperature to that memory device is known as a cross-temperature condition, which can lead to device reliability issues.

Techniques disclosed herein can be used to improve cross-temperature coverage of memory devices and improve memory device reliability when the temperature delta is wider than the acceptable range. More specifically, a memory trim set can be selected from multiple candidate memory trim sets when performing a memory operation (such as a memory write operation), based on a temperature metric and a P/E cycle metric for the memory device. The multiple candidate memory trim sets include multiple respective memory trim values (e.g., memory configuration parameters, such as program voltage step size, program pulse width, program verify level, etc., as discussed above) for performing the memory operation. The temperature metric can be indicative of a temperature of at least a region of the memory device (e.g., the entire device, a memory plane, a memory block, etc.), and the P/E cycle metric can be indicative of a number of P/E cycles performed by the memory device within a selected time interval (e.g., total number of P/E cycles performed for the life of the device, since device start-up, since a specific date, or a another metric of write activity) of either that same region or a (typically) physically related region of the memory device. By selecting a memory trim set from multiple different candidate memory trim sets based on the temperature metric and the P/E cycle metric, optimal memory trim values are used for performing memory operations (e.g., a data write operation), to reduce the cross-temperature effects and increase the memory device reliability.

Memory devices include individual memory die, which may, for example, include a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, such as a "host" as discussed later herein. In such managed memory devices, the controller functionality may be implemented on one or more die also incorporating a memory array or on a separate die. In other examples, one or more memory devices may be combined with controller functionality to form a solid-state drive (SSD) storage volume.

Embodiments of the present disclosure are described in the example of managed memory devices implementing NAND flash memory cells, termed "managed NAND" devices. These examples, however, are not limiting on the scope of the disclosure, which may be implemented in other forms of memory devices and/or with other forms of storage technology.

Both NOR and NAND flash architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series-coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. More specifically, flash memory cells use threshold voltages (Vth) to represent data information. The Vth of each state in a flash memory can be fixed by, e.g., a memory controller so that each memory state (i.e., a data pattern) represents a particular threshold voltage level. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, an embedded Multimedia Card (MMC) device (eMMC™), or the like. For example, in the case of the above examples, UFS devices may be configured in accordance with Joint Electron Device Engineering Council (JEDEC) standards (e.g., JEDEC standard JESD223D, entitled "JEDEC UFS Flash Storage 3.0," and/or updates or subsequent versions to such standard. Similarly, identified eMMC devices may be configured in accordance with JEDEC standard JESD84-A51, entitled "JEDEC eMMC standard 5.1," and/or updates or subsequent versions to such standard.

An SSD can be used as, among other things, the main memory device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed NAND devices can be used as primary or ancillary memory in various forms of electronic devices and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). Similarly, managed NAND devices can include one or more arrays of volatile and/or nonvolatile memory separate from the NAND storage array, and either within or separate from a controller. Both SSDs and managed NAND devices can receive commands from a host in association with memory operations, such as read or write operations to transfer data (e.g., user data and associated integrity data, such as error data and address data, etc.) between the memory devices and the host, or erase operations to erase data from the memory devices.

Although embodiments are discussed in this document with reference to NAND media, said embodiments are not limited to NAND media and may be applied to NOR media. Furthermore, although embodiments are discussed primarily in reference to managed NAND devices, the described embodiments may alternatively be implemented with other types of non-volatile storage technologies such as nanowire memory, FeRAM, magnetoresistive random access memory (MRAM), flash memory, Spin Torque Transfer Random Access Memory (STTRAM), RRAM, byte addressable 3-Dimensional Cross Point Memory (3D X-Point), PCM (Phase Change Memory), and so forth.

FIG. 1 illustrates an example of an environment 100 including a host device 105 and a memory device 110 configured to communicate over an interface 111. The host device 105 or the memory device 110 that may be included in a variety of products 150, such as Internet of Things (IoT) devices (e.g., a refrigerator or other appliance, a sensor, a motor or an actuator, a mobile communication device, an automobile, a drone, etc.) to support processing, communications, or control of the product 150.

The memory device 110 includes a memory controller 115 and a memory array 120, The memory array 120 may include a number of individual memory die (e.g., a two-dimensional (2D) NAND die, or a stack of 3D NAND die).

3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs), metal-oxide semiconductor (MOS) structure devices, or the like. In some examples, the strings will extend vertically, through multiple vertically spaced tiers containing respective word lines. A semiconductor structure may extend adjacent a string of storage cells to form a channel for the storage cells of the string. In the example of a vertical string, the polysilicon structure may be in the form of a vertically extending pillar. In some examples, the string may be "folded," and thus arranged relative to a U-shaped pillar. In other examples, multiple vertical structures may be stacked upon one another to form stacked arrays of storage cell strings.

In 3D architecture semiconductor memory technology, vertical structures are stacked, increasing the number of tiers, physical pages, and accordingly, the density of a memory device. In an example, the memory device 110 can be a discrete memory component of a host device. In other examples, the memory device 110 can be a portion of an integrated circuit (e.g., system on a chip (SOC), etc.), stacked or otherwise included with one or more other components of a host device.

The memory controller 115 can communicate with the memory array 120, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between a host and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from the host 105 via the interface 111) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between a host and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

In some examples, the memory array 120 may comprise a number of NAND dies and one or more functions of the memory controller 115 may be implemented on an on-die controller on that particular die. Other organizations and delineations of control functionality may also be utilized, such as a controller for each die, plane, superblock, block, page, and the like.

Memory array 120 can include several memory cells arranged in, for example, one or more semiconductor dies, with each die having memory cells arranged in planes, blocks, sub-blocks, and/or pages. In operation, data is typically written to or read from the NAND memory device 110 in pages and erased in blocks. However, one or more memory operations (e.g., read, write, erase, etc.) can be performed on larger or smaller groups of memory cells, as desired. The data transfer size of a NAND memory device 110 is typically referred to as a page; whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a MLC NAND flash device may have a higher bit error rate than a corresponding SLC NAND flash device. As such, the MLC device may require more metadata bytes for error data than the corresponding SLC device.

In some aspects, the memory controller 115 is configured (e.g., hardware and/or software implementation) to perform the techniques discussed herein for improving cross-temperature coverage of memory storage systems, including the exemplary methods discussed herein in connection with FIG. 5-FIG. 9. For example, the memory controller 115 can store instructions for performing the techniques discussed herein for improving cross-temperature coverage of memory devices.

In some aspects, the instructions can be included (for example, as firmware within the array controller 135), such as firmware of a temperature management module 160 and a P/E cycle management module 170 that provide functionalities in connection with selecting a memory trim set from multiple candidate memory trim sets that include multiple respective memory trim values for performing memory operations. The temperature management module 160 is configured to maintain a temperature metric 162, which is indicative of temperature applicable to at least a monitored region of the memory device 110. In an example, the temperature metric 162 includes two or more status bits that indicate a temperature range for the region of the memory device. The temperature range can be one of a predetermined number (e.g., two or more) of temperature ranges, with each temperature range having a corresponding temperature metric with which it is associated. In this regard, in aspects when at least two different temperature ranges are used for monitoring temperature within the memory device 110, the temperature metric 162 can be selected from at least two possible temperature metrics associated with the at least two different temperature ranges. The use of at least three temperature ranges (e.g., a cold temperature range, a normal temperature range, and a hot temperature range) for selecting a memory trim set is illustrated in connection with FIG. 5 and FIG. 7. However, in some other aspects, the temperature metric 162 can include status bits indicating one of two available temperature ranges.

In some aspects, the temperature metric 162 can indicate a temperature value for a sensed temperature associated with the monitored region of the memory device. In this case, one of the predetermined number of temperature ranges can still be selected based on the sensed temperature value indicated by the temperature metric 162.

The monitored region can include the entire memory device 110, the memory array 120, one or more units of memory cells within the memory array 120 (e.g., planes, blocks, sub-blocks, or pages) of an individual memory device.

The P/E cycle management module 170 is configured to maintain a P/E cycle metric 172, which is indicative of a number of program-erase cycles performed by the memory device 110 within a selected time interval. In an example, the P/E cycle metric 172 includes two or more status bits that indicate a P/E cycle range for the number of P/E cycles performed by the memory device within the selected time interval. The P/E cycle range can be one of a predetermined number (e.g., two or more) of P/E cycle ranges, with each P/E cycle range having a corresponding P/E cycle metric with which it is associated. In this regard, in aspects when three different P/E cycle ranges are used for monitoring the number of P/E cycles within the memory device 110, the P/E cycle metric 172 can be selected from at least three possible P/E cycle metrics associated with the three different P/E cycle ranges. The use of at least three P/E cycle ranges for selecting a memory trim set is illustrated in connection with FIG. 7.

In some aspects, the P/E cycle metric 172 can be a running count of the number of P/E cycles associated with the memory device 110 (e.g., a count of the number of P/E cycles since device manufacturing time, since device startup, etc.). In this case, a P/E cycle range can be selected from the predetermined number of P/E cycle ranges using the running count of the number of P/E cycles as indicated by the P/E cycle metric 172.

In some aspects, the temperature metric 162 and the P/E cycle metric 172 can be stored by the memory manager 125 in, e.g., the set of management tables 130 or at another location within the memory device 110. Additionally, the temperature metric 162 and the P/E cycle metric 172 can be continuously (or periodically) updated by the management modules 160 and 170, and can be retrieved (e.g., upon the memory device 110 receiving a memory operation command such as a memory write command) for purposes of selecting a memory trim set from multiple candidate memory trim sets that include multiple respective memory trim values for configuring operation parameters. Alternatively, the temperature metric 162 and the P/E cycle metric 172 can be determined in response to (i.e., after) the memory device 110 receiving the memory operation command.

Figure 2:
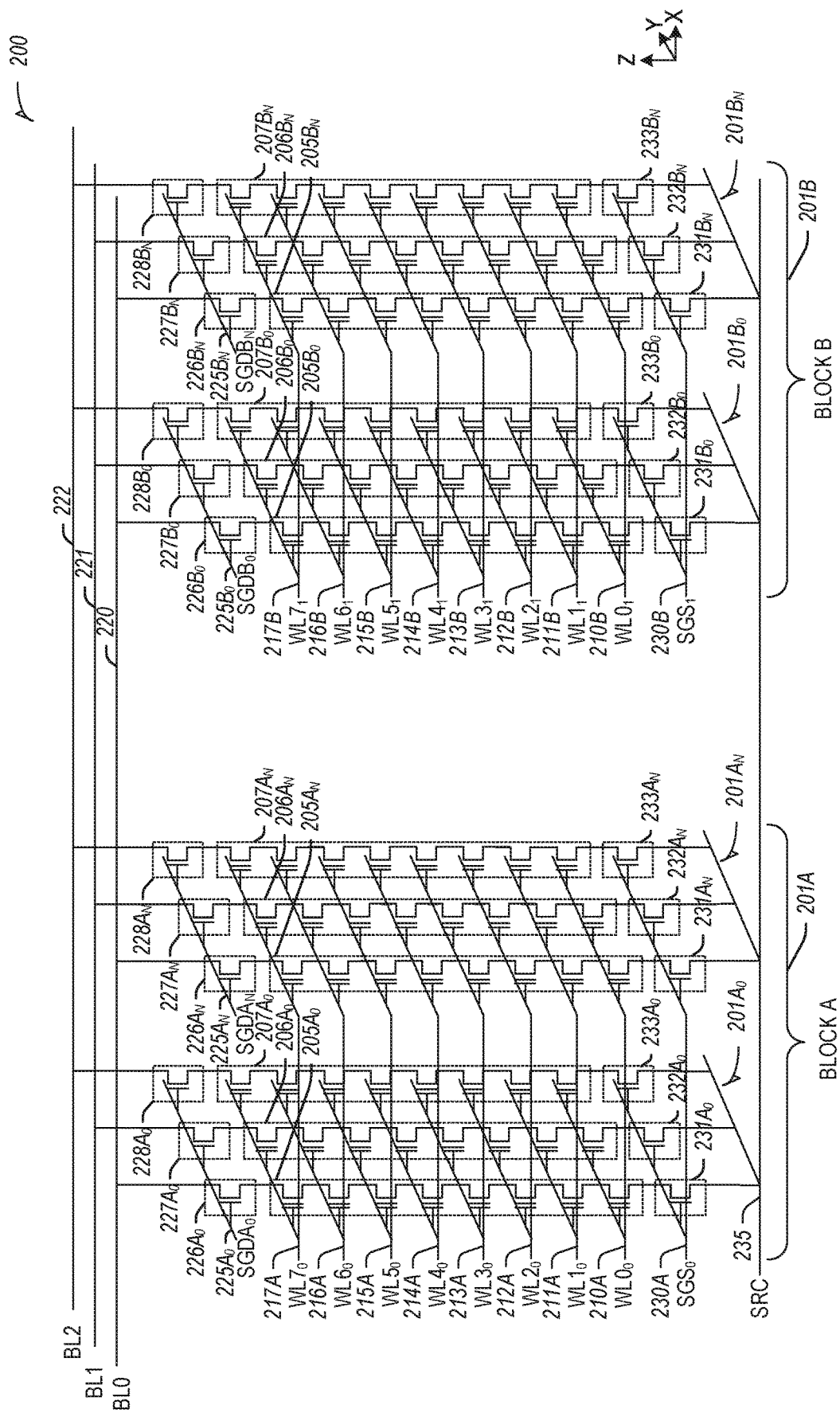
FIGS. 2 and FIG. 3 are schematic diagrams illustrating examples of NAND architecture semiconductor memory array.

FIG. 2 is a schematic diagram illustrating an example of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ 201$A_0$, sub-block $A_n$ 201$A_n$, sub-block $B_0$ 201$B_0$, sub-block $B_n$ 201$B_n$, etc.). The memory array 200 represents a portion of a greater number of similar structures that would typically be found in a unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, with each block having two sub-blocks, and each sub-block having a single physical page, with each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an SGD line $SGDA_n$ $225A_n$, first-third $B_0$ SGD $226B_0$-$228B_0$ can be accessed using a $B_0$ SGD line $SGDB_0$ $225B_0$, and first-third $B_n$ SGD $226B_n$-$228B_n$ can be accessed using a $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed via a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs), select gates, and so forth, and specific memory cells at one or more tiers in the specific strings can be accessed, selected, or controlled using one or more access lines (e.g., WLs).

In an example, the memory array 200 (which can be the same as memory array 120 of FIG. 1) can be configured so that operating temperature of at least one area of the array can be periodically sensed (or measured) by a management module, such as the temperature management module 160 of FIG. 1, in connection with selection of a memory trim set from multiple candidate memory trim sets. More specifically, the temperature management module 160 can maintain the temperature metric 162 to reflect the operating temperature associated with the at least one area of the memory array 200. For example, the temperature metric 162 can be indicative of temperature associated with a string of memory cells (e.g., any of memory strings $205A_0$-$207A_0$, $205A_n$-$207A_n$, $205B_0$-$207B_0$, and $205B_n$-$207B_n$), a block (e.g., any of block A 201A, block B 201B, etc.), a sub-block (e.g., any of sub-block $A_0$ 201$A_0$, sub-block $A_n$ 201$A_n$, sub-block $B_0$ 201$B_0$, sub-block $B_n$ 201$B_n$, etc.), or a combination thereof.

Figure 3:
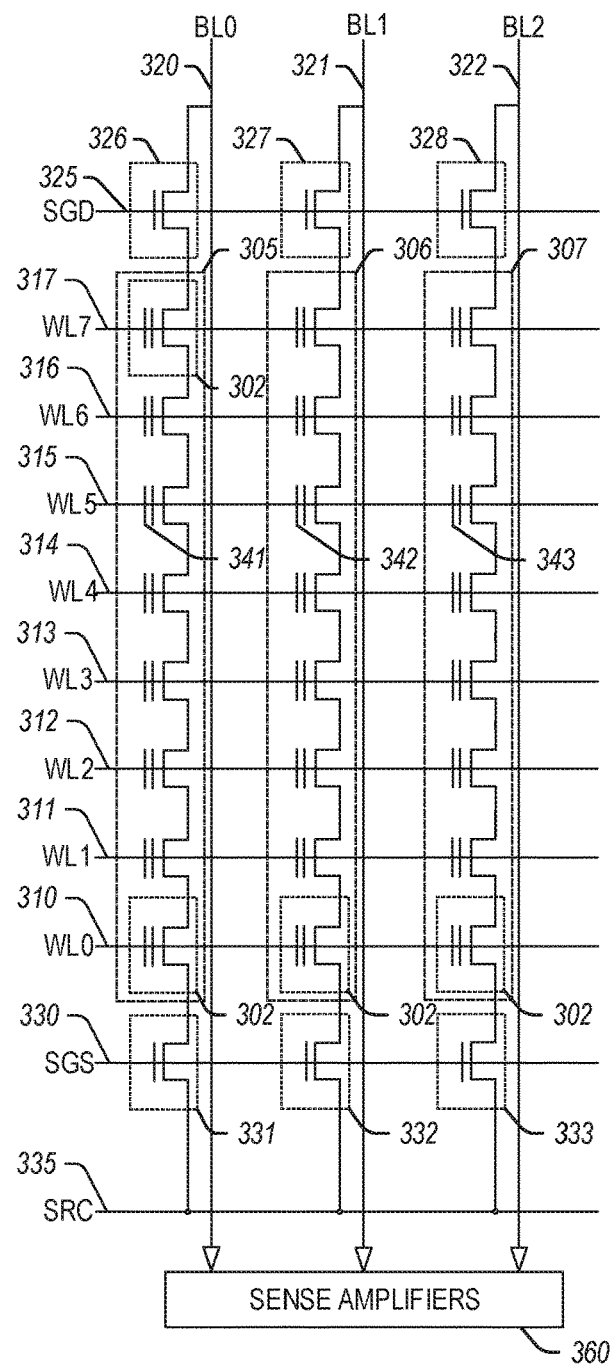

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) 335 using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential Vss, can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage ($V_{Pass}$) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential Vss.

As an example, if a programming voltage (e.g., 15V or more) is applied to a specific word line, such as WL4, a pass voltage of 10V can be applied to one or more other word lines, such as WL3, WL5, and the like, to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, and so forth. In other examples, the pass voltages, number of word lines, or the like, can be higher or lower or more or less.

As mentioned above, flash memory uses threshold voltages (Vth) to represent data information. More specifically, the sense amplifiers 360, coupled to one or more of the data lines (e.g., first, second, or third bit lines (BL0-BL2) 320-322), can detect the state of each memory cell in respective data lines by sensing a voltage or current on a particular data line, and comparing the sensed voltage to the threshold voltage. The Vth of each state in a flash memory can be fixed by a memory controller so that each memory state (i.e., a data pattern) represents a particular threshold voltage level. In some aspects, and as discussed herein (e.g., in connection with FIGS. 5-9), the threshold voltage level can be included as a memory trim value in multiple candidate memory trim sets for write operation parameters, so that a different threshold voltage can be used for detecting a memory cell state based on a selected memory trim set.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground Vss, resulting in a charge transfer (e.g., direct injection or FN tunneling, etc.) from the floating gates of the targeted memory cells to the channels.

Figure 4:
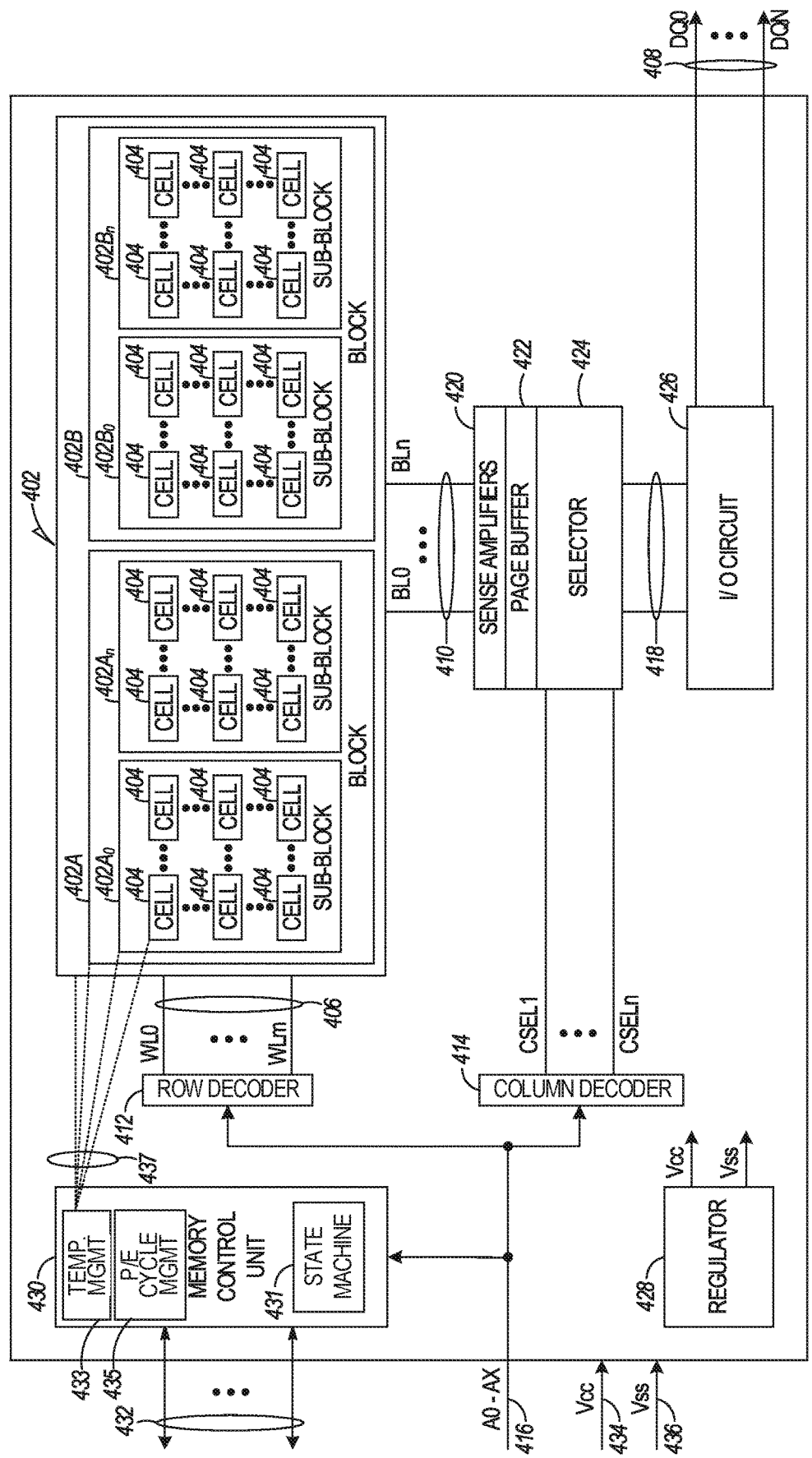
FIG. 4 is a block diagram illustrating an example of a memory module.

FIG. 4 is a block diagram illustrating an example of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an I/O circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, with each page including a number of memory cells 404. Although illustrated herein as having two blocks, with each block having two sub-blocks, and each sub-block having a number of memory cells 404, in other examples, the memory array 402 can include more or fewer blocks, sub-blocks, memory cells, and the like. In other examples, the memory cells 404 can be arranged in a number of rows, columns, pages, sub-blocks, blocks, and the like, and accessed using, for example, access lines 406, first data lines 410, or one or more select gates, source lines, and so forth.

The memory control unit 430 can control memory operations of the memory device 400 according to one or more signals or instructions received on control lines 432, including, for example, one or more clock signals or control signals that indicate a desired operation (e.g., write, read, erase, etc.) or address signals (A0-AX) received on one or more address lines 416. One or more devices external to the memory device 400 can control the values of the control signals on the control lines 432 or the address signals on the address line 416. Examples of devices external to the memory device 400 can include, but are not limited to, a host, a memory controller, a processor, or one or more circuits or components not illustrated in FIG. 4.

In some aspects, the memory control unit 430 is configured to include a temperature management module 433 and a P/E cycle management module 435, which can be similar in functionality to the temperature management module 160 and the P/E cycle management module 170 of FIG. 1. For example, the temperature management module 433 can use communication links 437 with one or more areas of the memory array 402 to detect or sense operating temperature associated with such areas in order to generate or update a temperature metric (e.g., temperature metric 162). The P/E cycle management module 435 is configured to generate a P/E cycle metric, similar to the P/E cycle metric 172 described in connection with FIG. 1.

The memory device 400 can use access lines 406 and first data lines 410 to transfer data to (e.g., write or erase) or from (e.g., read) one or more of the memory cells 404. The memory control unit 430 may include a state machine 431 coupled to the row decoder 412, the column decoder 414, and the I/O circuit 426. The state machine 413 can also output status data of the flash memory such as READY/

BUSY or PASS/FAIL. In some designs, the state machine 413 can be configured to manage the programming process. The row decoder 412 and the column decoder 414 can receive and decode the address signals (A0-AX) from the address line 416, determine which of the memory cells 404 are to be accessed, and provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402 or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418. In some examples, a flash translation layer (not shown) can map addresses provided by a host to physical memory addresses used by the row decoder 412 and column decoder 414 to read data in the memory array 402.

The memory control unit 430 can receive positive and negative supply signals, such as a supply voltage Vcc 434 and a ground potential Vss 436, from an external source or supply (e.g., an internal or external battery, an AC-to-DC converter, etc.). In certain examples, the memory control unit 430 can include a regulator 428 to internally provide positive or negative supply signals.

Figure 5:
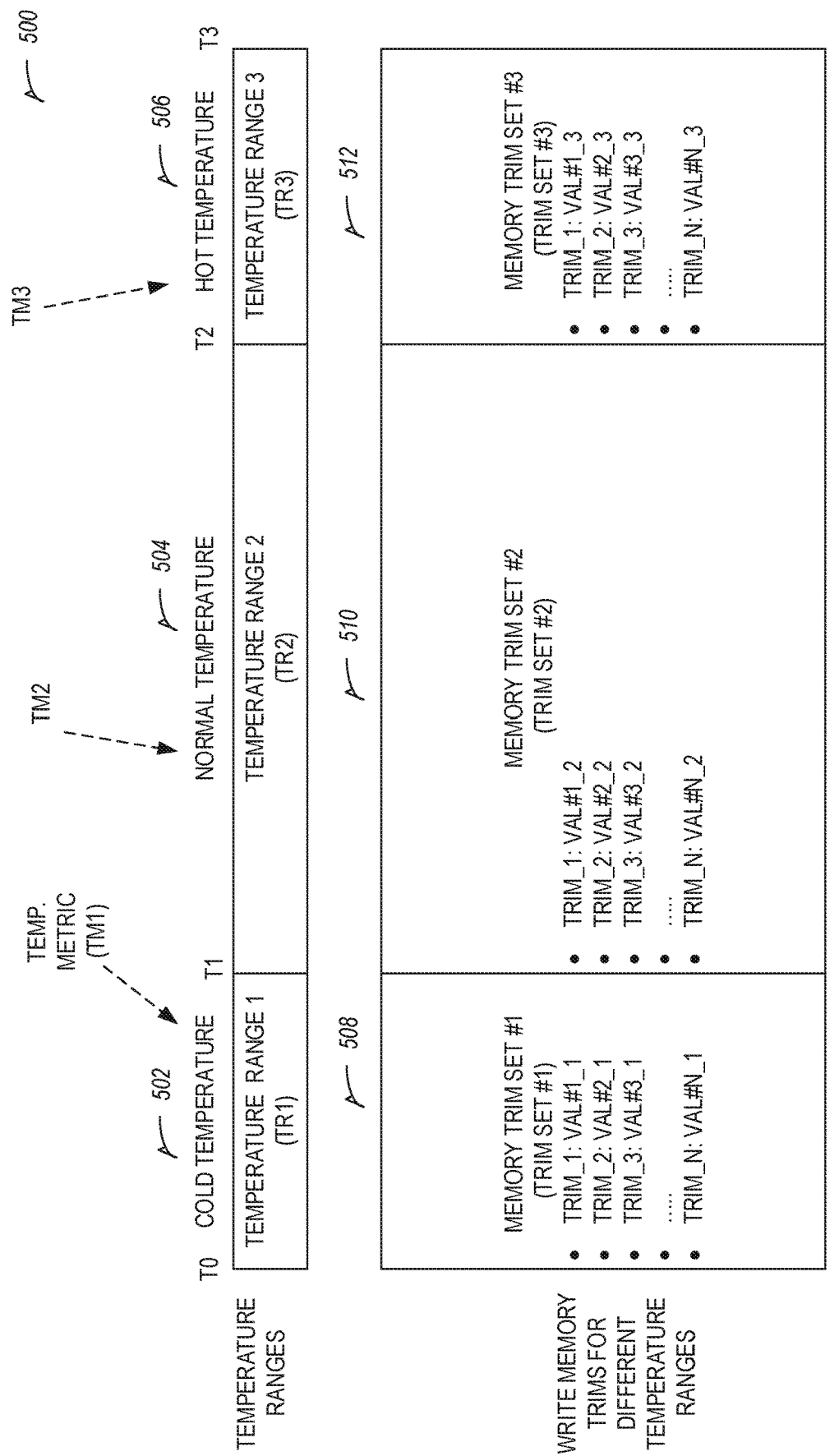
FIG. 5 is a block diagram of example temperature ranges and corresponding memory trim sets.

FIG. 5 is a block diagram of example temperature ranges and corresponding memory trim sets. Referring to FIG. 5, diagram 500 illustrates multiple temperature ranges, such as temperature ranges 502, 504, and 506, which can be used in connection with selection of a memory trim set from a corresponding number of multiple candidate memory trim sets 508, 510, and 512 respectively, based on a temperature metric.

As illustrated in FIG. 5, the first temperature range 502 (also referred to as a "cold temperature range") covers a temperature range between threshold temperatures T0 and T1, the second temperature range 504 (also referred to as a "normal temperature range") covers a temperature range between threshold temperatures T1 and T2, and the third temperature range 506 (also referred to as a "hot temperature range") covers a temperature range between threshold temperatures T2 and T3.

Each of the temperature ranges 502, 504, and 506 is associated with a corresponding memory trim set 508, 510, and 512, respectively. Additionally, each of the memory trim sets 508-512 includes multiple memory trim values (e.g., values VAL 1_1, . . . , VAL N_1, VAL 1_2, . . . , VAL N_2, VAL 1_3, . . . , VAL N_3) for memory operation parameters (or trims) (e.g., write memory operation parameters TRIM_1, . . . , TRIM_N).

In some aspects, example trims that can be included in the multiple candidate memory trim sets 508-512 include the following: a temperature coefficient, a program voltage step size, a threshold voltage distribution for data writes, a program pulse width for writing to the memory device, one or more program verify voltage levels, and potentially one or more other parameters of the write operation.

In operation, a temperature metric (e.g., 162) associated with a region of the memory device (e.g., 110) can be identified by the memory controller 115 in response to receiving a memory operation command, such as a write command, via a host interface. As discussed in connection with FIG. 1, the temperature metric can include status bits that indicate a temperature range of multiple available temperature ranges. In the example illustrated in FIG. 5, the temperature metric can be one of at least three possible temperature metrics, such as TM1, TM2, and TM3, which indicate corresponding temperature ranges 502, 504, and 506 respectively. The memory controller 115 can continuously (or periodically) monitor temperature associated with the region of the memory device and adjust the temperature metric as needed. In this regard, the temperature metric maintained by the temperature management module 160 can be predetermined and be available prior to the memory device receiving the memory operation command. Consequently, the temperature metric can be identified in response to the memory device receiving the memory operation command (e.g., the memory write command).

In aspects when the temperature metric is an indication of the temperature associated with the region of the memory device (rather than an indication of a temperature range as discussed above), then a temperature range can be selected from the available temperature ranges 502-506 based on the temperature indicated by the metric. A memory trim set that corresponds to the selected temperature range can be selected from the multiple available memory trim sets 508-512.

Even though FIG. 5 illustrates three separate temperature ranges with corresponding three memory trim sets, the disclosure is not limited in this regard and a different number of temperature ranges with a corresponding number of memory trim sets can be used instead. In some aspects, the temperature management module 160 can configure the number of temperature ranges or the threshold temperatures (e.g., T0-T3) associated with each temperature range dynamically, based on one or more memory device characteristics such as available memory capacity, number of P/E cycles, or other performance characteristics.

Figure 6:
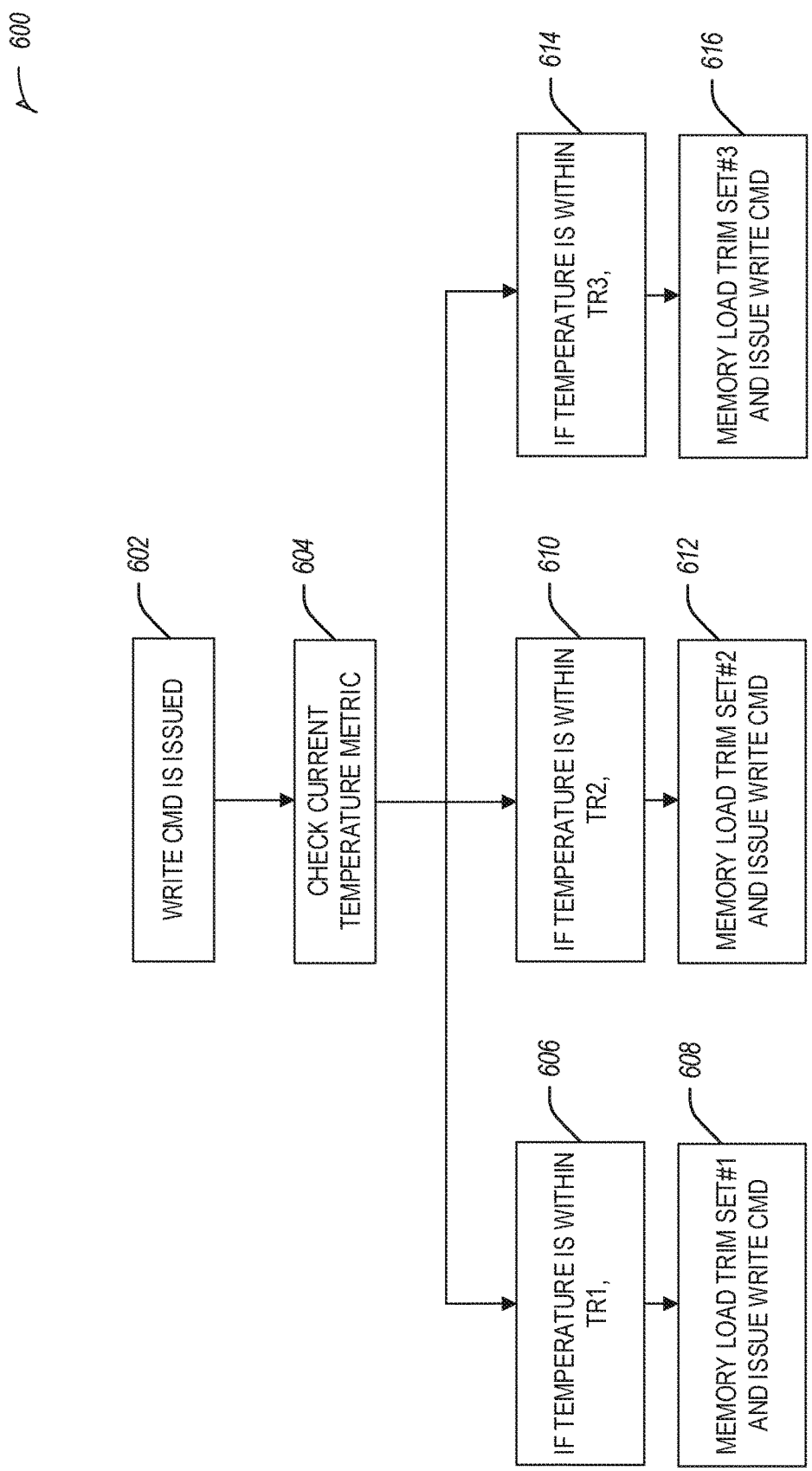
FIG. 6 is a flow diagram of an example of a method for executing a write command using a temperature metric to select from the memory trim sets of FIG. 5.

FIG. 6 is a flow diagram of an example of a method 600 for executing a write command using a temperature metric to select from the memory trim sets 508-512 of FIG. 5. The method 600 can include operations 602, 604, 606, 608, 610, 612, 614, and 616, which can be performed by the memory controller 115 of memory device 110. At operation 602, a write command is issued and received by the memory device 110 (e.g., received from the host 105 via interface 111). At operation 604, the memory controller 115 can identify a current temperature metric, such as temperature metric 162. In some aspects, the temperature metric 162 can identify a temperature associated with a region of the memory device 110. During operations 606, 610, and 614, the memory controller 115 can determine whether the identified temperature indicated by the temperature metric is within temperature ranges 502, 504, and 506 respectively. In some aspects, the temperature metric can include two or more selection bits that identify one of the temperature ranges 502-506 directly. Based on the temperature range that the current temperature falls within, one of operations 608, 612, and 616 is performed by the memory controller 115 to select one of corresponding memory trim sets 508, 510, and 512. The memory trim values of the selected memory trim set are memory loaded, and the received write command is executed to write data into a storage region of the device 110 using the trim values for write operation parameters within the selected memory trim set.

Figure 7:
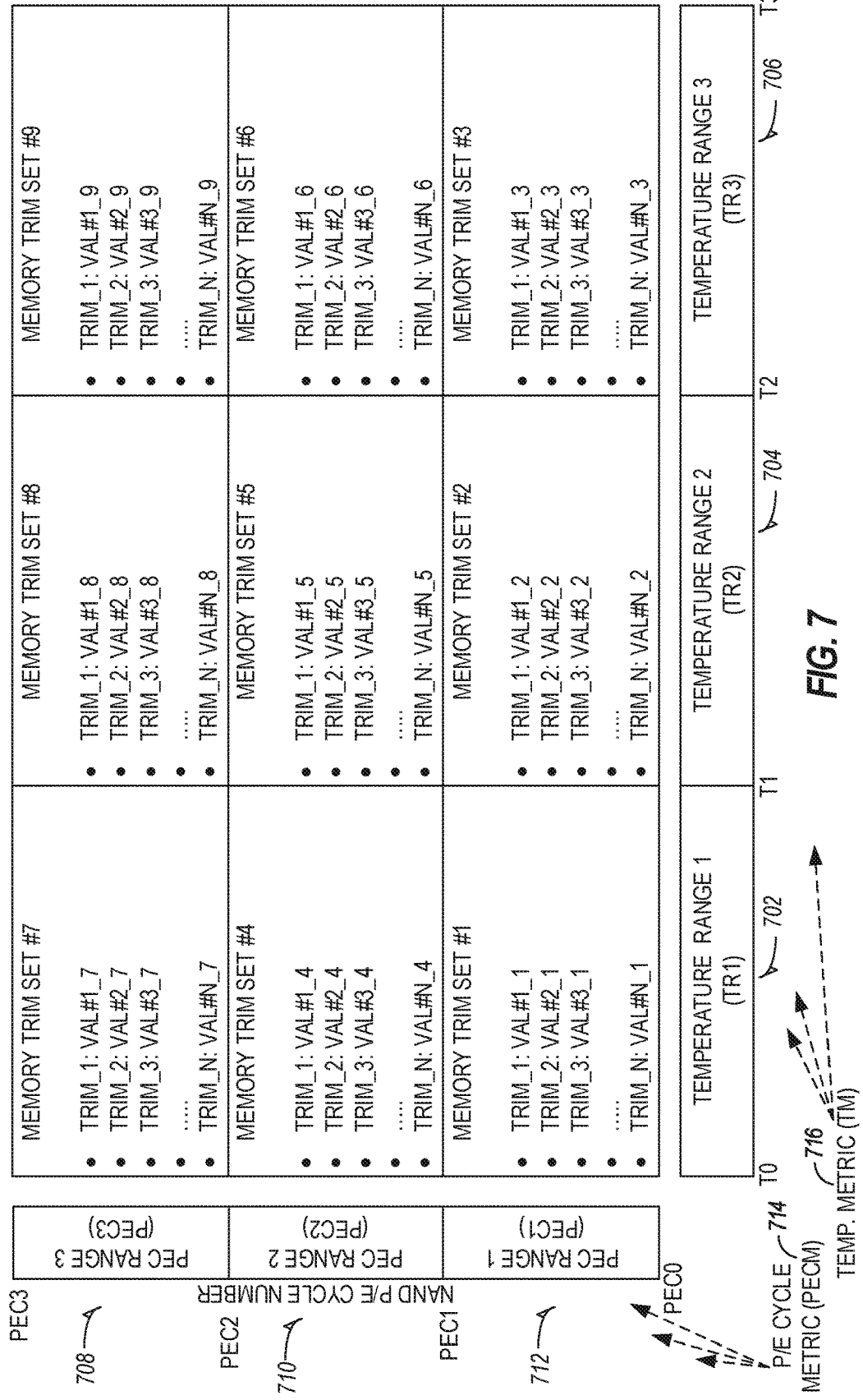
FIG. 7 is a block diagram of example temperature ranges and Program/Erase (P/E) cycle ranges with corresponding memory trim sets.

FIG. 7 is a block diagram 700 of example temperature ranges 702-706 and P/E cycle ranges 708-712 with corresponding memory trim sets. The multiple temperature ranges 702, 704, and 706, as well as the multiple P/E cycle ranges 708, 710, and 712, can be used in connection with selection of a memory trim set from a corresponding number of multiple candidate memory trim sets (e.g., memory trim sets #1 through #9) based on a temperature metric (TM) 716 and a P/E cycle metric (PECM) 714. The PECM 714 and TM 716 can be the same as P/E cycle metric 172 and temperature metric 162 of FIG. 1.

As illustrated in FIG. 7, the first temperature range 702 covers a temperature range between threshold temperatures T0 and T1, the second temperature range 704 covers a temperature range between threshold temperatures T1 and T2, and the third temperature range 706 covers a temperature range between threshold temperatures T2 and T3.

Each of the temperature ranges 702, 704, and 706 is associated with multiple corresponding memory trim sets. For example, temperature range 702 is associated with memory trim sets #1, #4, or #7; temperature range 704 is associated with memory trim sets #2, #5, or #8; and temperature range 706 is associated with memory trim sets #3, #6, or #9, Additionally, each of the memory trim sets #1-#9 includes multiple memory trim values (e.g., values VAL 1_1 in set #1 through VAL N_9 in set #9) for memory operation parameters (or trims) (e.g., write memory operation parameters TRIM_1, . . . , TRIM_N). In some aspects, example trims that can be included in the multiple candidate memory trim sets #1-#9 include the following: a temperature coefficient, a program voltage step size, a threshold voltage distribution for data writes, a program pulse width for writing to the memory device, one or more program verify voltage levels, and potentially additional parameters.

Additionally, the first P/E cycle range 712 covers a range between threshold P/E cycle values of PEC0 and PEC1, the second P/E cycle range 710 covers a range between threshold P/E cycle values of PEC1 and PEC2, and the third P/E cycle range 708 covers a range between threshold P/E cycle values of PEC2 and PEC3. Each of the P/E cycle ranges 708-712 is associated with multiple corresponding memory trim sets. For example, P/E cycle range 708 is associated with memory trim sets #7, #8, or #9; P/E cycle range 710 is associated with memory trim sets #4, #5, or #6; and P/E cycle range 712 is associated with memory trim sets #1, #2, or #3.

In this regard, a specific memory trim set can be selected from the multiple candidate memory trim sets #1-#9 using the temperature metric 716 and the P/E cycle metric 714.

In operation, a temperature metric (e.g., 162 or 716) associated with a region of the memory device (e.g., 110) can be identified by the memory controller 115 in response to receiving a memory operation command, such as a write command, via a host interface. Additionally, a P/E cycle metric (e.g., 172 or 714) associated with a number of program-erase cycles performed by the memory device within a selected interval is also identified by the memory controller 115. As discussed in connection with FIG. 1, both the temperature metric and the P/E cycle metric can include status bits that indicate, respectively, a temperature range of multiple available temperature ranges and a P/E cycle range of multiple available P/E cycle ranges. The memory controller 115 can continuously (or periodically) monitor temperature associated with the region of the memory device and adjust the temperature metric (162 or 716) as needed. In this regard, the temperature metric maintained by the temperature management module 160 can be predetermined and be available prior to the memory device receiving the memory operation command. Similarly, the P/E cycle metric (172 or 714) can also be predetermined and be available prior to the memory device receiving the memory operation command. Consequently, the temperature metric and the P/E cycle metric can be identified in response to the memory device receiving the memory operation command (e.g., the memory write command).

Even though FIG. 7 illustrates three separate temperature ranges and three separate P/E cycle ranges, the disclosure is not limited in this regard and a different number of temperature ranges and P/E cycle ranges can be used instead. Additionally, even though FIG. 7 illustrates a separate memory trim set for each of the nine possible combinations between a temperature metric and a P/E cycle metric, the disclosure is not limited in this regard and a different number of memory trim sets can be used (e.g., one or more of the memory trim sets can be repeated for different temperature metric—P/E cycle metric combinations). In some aspects, the temperature management module 160 and the P/E cycle management module 170 can configure the number of temperature ranges or the threshold temperatures (e.g., T0-T3) as well as the number of P/E cycle ranges or the threshold P/E cycle values (e.g., PEC0-PEC3) dynamically, based on one or more memory device characteristics such as available memory capacity, number of P/E cycles, or other performance characteristics.

Figure 8:
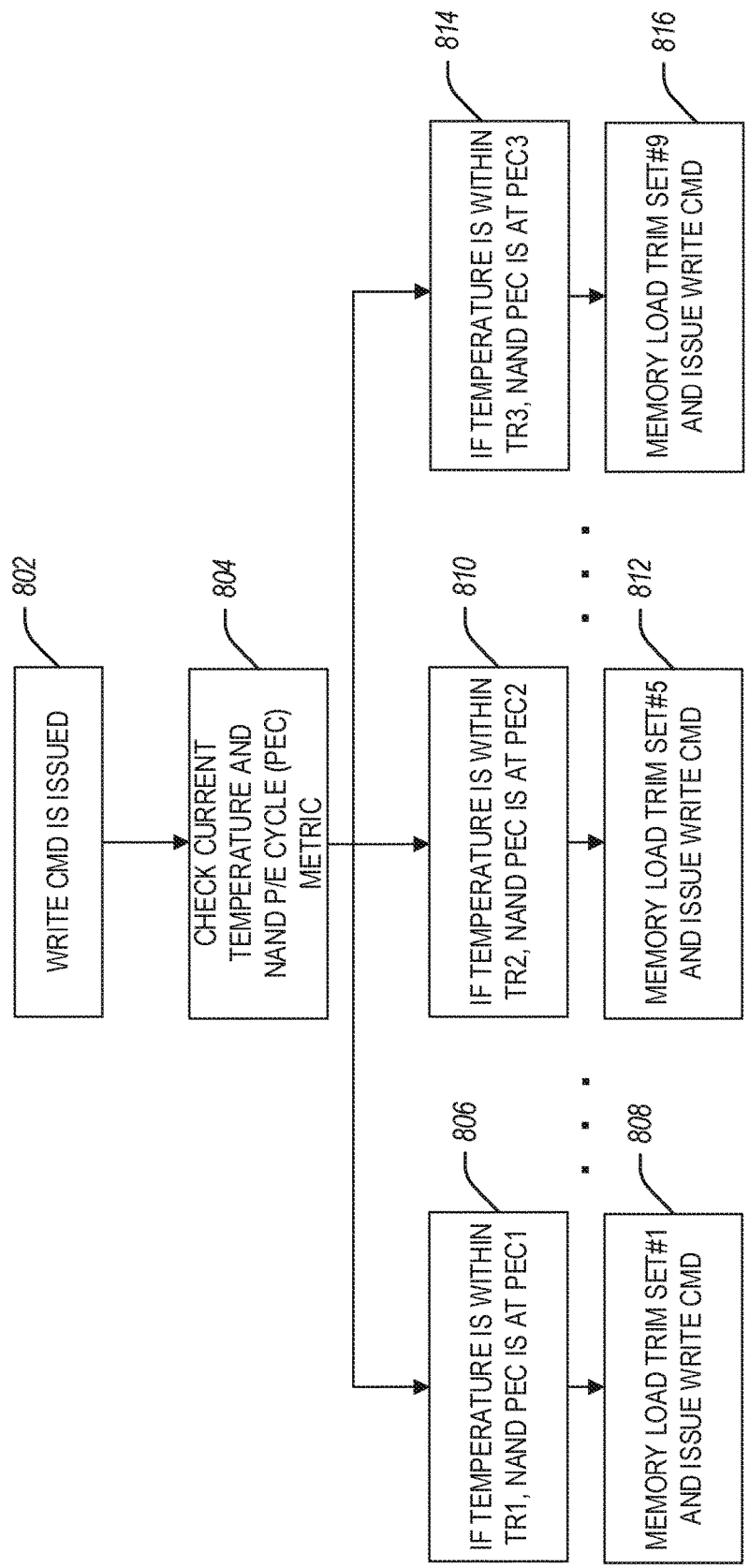
FIG. 8 is a flow diagram of an example of a method for executing a write command using a temperature metric and a P/E cycle metric to select from the memory trim sets of FIG. 7.

FIG. 8 is a flow diagram of an example of a method 800 for executing a write command using a temperature metric and a P/E cycle metric to select from the memory trim sets of FIG. 7. The method 800 can include operations 802, 804, 806, 808, 810, 812, 814, and 816, which can be performed by the memory controller 115 of memory device 110. At operation 802, a write command is issued and received by the memory device 110 (e.g., received from the host 105 via interface 111). At operation 804, the memory controller 115 can identify a current temperature metric (e.g., 162 or 716) and a P/E cycle metric (e.g., 172 or 714). In some aspects, the temperature metric 162 can identify a temperature associated with a region of the memory device 110. During operations 806, 810, . . . , and 814, the memory controller 115 can determine whether the identified temperature indicated by the temperature metric is within one of the available temperature ranges 702, 704, and 706, and whether the identified P/E cycle metric is within one of the P/E cycle ranges 708, 710, and 712. In some aspects, the temperature metric can include two or more selection bits that identify one of the temperature ranges 702-706 directly. Similarly, the P/E cycle metric can include two or more different selection bits that identify one of the P/E cycle ranges 708-712 directly.

Based on the temperature range that the current temperature falls within and the P/E cycle range that the P/E cycle metric is associated with, one of operations 808, 812, and 816 is performed by the memory controller 115 to select one of the memory trim sets #1-#9, based on the temperature range and the P/E cycle range that are detected using the identified temperature and P/E cycle metrics. The memory trim values of the selected memory trim set are memory loaded, and the received write command is executed to write data into a storage region of the device 110 using the trim values for write operation parameters within the selected memory trim set.

Figure 9:
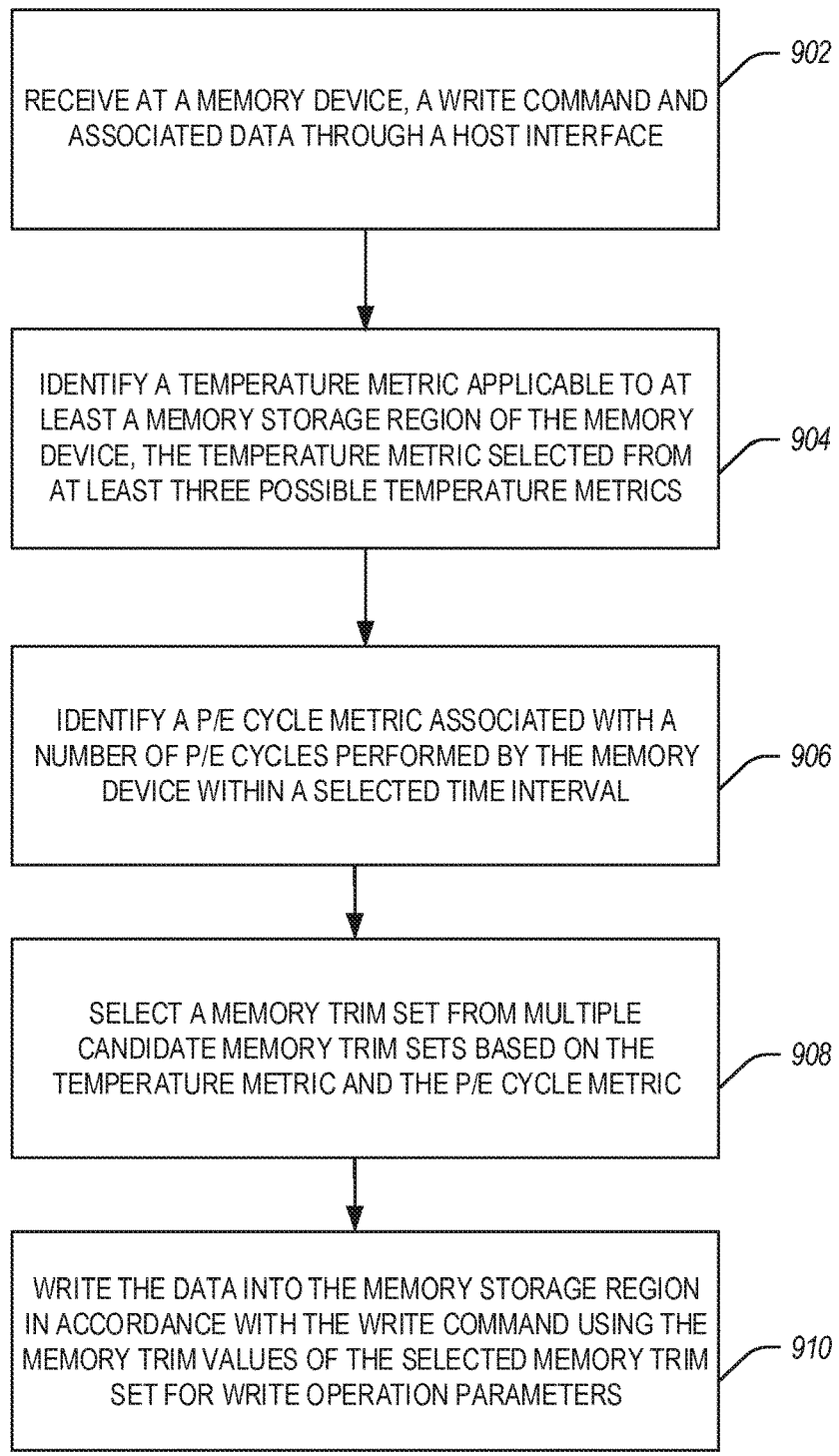
FIG. 9 is a flow diagram of another example of a method for executing a command using memory trim values of a selected memory trim set.

FIG. 9 is a flow diagram of an example of a method 900 for executing a command using memory trim values of a selected memory trim set. The method 900 can include operations 902, 904, 906, 908, and 910, which can be performed by the memory controller 115 of memory device 110. At operation 902, a write command and associated data is received at a memory device through a host interface. For example, a write command can be received by memory device 110 from host 105 via interface 111. At operation 904, a temperature metric applicable to at least a memory storage region of the memory device is identified, where the temperature metric is selected from at least three possible temperature metrics. For example, the memory controller 115 can identify temperature metric 162, which is configured and maintained by the temperature management module 160 prior to the device 110 receiving the write command. The temperature metric 162 can be selected from at least three possible temperature metrics (e.g., T1, T2, and T3 illustrated in FIG. 7 with each metric associated with a separate temperature range), based on a monitored temperature of an area of the memory device 110.

At operation 906, a P/E cycle metric associated with a number of program-erase cycles performed by the memory device within a selected time interval is identified. For example, the memory controller 115 identifies a P/E cycle metric 172, which is configured and maintained by the P/E cycle management module 170. The P/E cycle metric 172 is indicative of the number of P/E cycles performed by the memory device 110 within a selected time interval. At operation 908, a memory trim set is selected from multiple candidate memory trim sets based on the temperature metric and the P/E cycle metric. For example, and in reference to FIG. 7, one of the candidate memory trim sets #1-#9 is selected based on the temperature metric 716 and the P/E cycle metric 714. The multiple candidate memory trim sets (e.g., trim sets #1-#9 in FIG. 7) can include multiple respective memory trim values for memory operation parameters, such as write operation parameters. At operation 910, the data is written into the memory storage region in accordance with the write command using the memory trim values of the selected memory trim set for write operation parameters.

Figure 10:
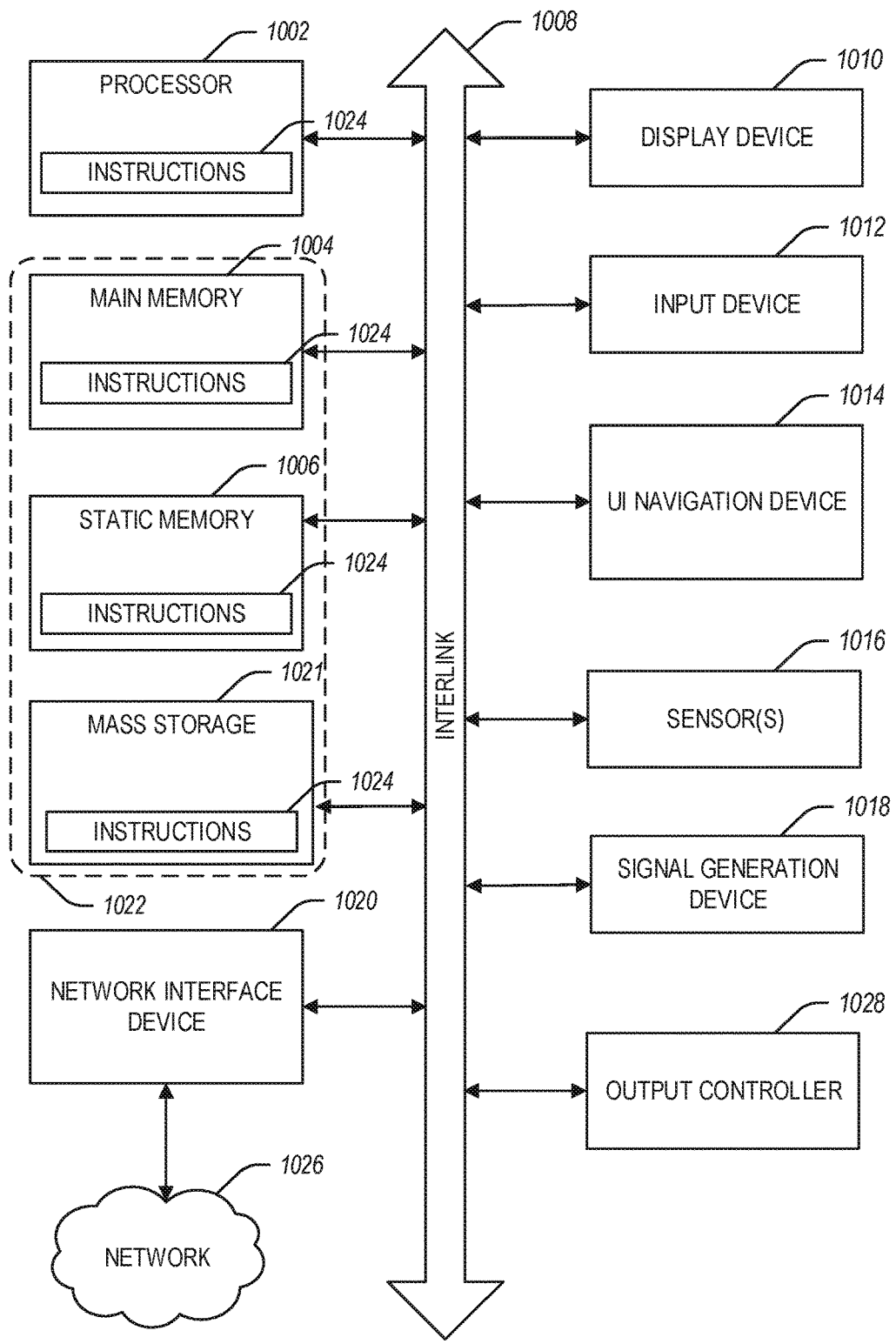
FIG. 10 is a block diagram illustrating an example of a machine upon which one or more embodiments may be implemented.

FIG. 10 illustrates a block diagram of an example machine 1000 upon which any one or more of the techniques (e.g., methodologies) discussed herein may perform. In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1000 (e.g., the host device 105, the memory device 110, etc.) may include a hardware processor 1002 (e.g., a central processing unit (CPU), a graphics processing unit (GPU), a hardware processor core, or any combination thereof, such as the memory controller 115, etc.), a main memory 1004 and a static memory 1006, some or all of which may communicate with each other via an interlink (e.g., bus) 1008. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The machine 1000 may include a machine readable medium 1022 on which is stored one or more sets of data structures or instructions 1024 (e.g., software) embodying or utilized by any one or more of the techniques or functions described herein. The instructions 1024 may also reside, completely or at least partially, within the main memory 1004, within static memory 1006, or within the hardware processor 1002 during execution thereof by the machine 1000. In an example, one or any combination of the hardware processor 1002, the main memory 1004, or the static memory 1006 may constitute the machine readable medium 1022.

While the machine readable medium 1022 is illustrated as a single medium, the term "machine-readable medium" may include a single medium or multiple media (e.g., a centralized or distributed database, or associated caches and servers) configured to store the one or more instructions 1024.

The term "machine-readable medium" may include any medium capable of storing or encoding instructions for execution by the machine 1000 and that cause the machine 1000 to perform any one or more of the techniques of the present disclosure, or capable of storing, encoding or carrying data structures used by or associated with such instructions. Non-limiting machine-readable medium examples include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and CD-ROM and DVD-ROM disks.

The instructions 1024 (e.g., software, programs, an operating system (OS), etc.) or other data are stored on the memory device 1021, can be accessed by the memory 1004 for use by the processor 1002. The memory 1004 (e.g., DRAM) is typically fast, but volatile, and thus a different type of storage than the memory device 1021 (e.g., an SSD), which is suitable for long-term storage, including while in an "off" condition. The instructions 1024 or data in use by a user or the machine 1000 are typically loaded in the memory 1004 for use by the processor 1002. When the memory 1004 is full, virtual space from the memory device 1021 can be allocated to supplement the memory 1004; however, because the storage 1021 device is typically slower than the memory 1004, and write speeds are typically at least twice as slow as read speeds, use of virtual memory can greatly reduce user experience due to memory device latency (in contrast to the memory 1004, e.g., DRAM). Further, use of the memory device 1021 for virtual memory can greatly reduce the usable lifespan of the memory device 1021.

In contrast to virtual memory, virtual memory compression (e.g., the Linux® kernel feature "ZRAM") uses part of the memory as compressed block storage to avoid paging to the memory device 1021. Paging takes place in the compressed block until it is necessary to write such data to the memory device 1021. Virtual memory compression increases the usable size of memory 1004, while reducing wear on the memory device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 1024 may further be transmitted or received over a communications network 1026 using a transmission medium via the network interface device 1020 utilizing any one of a number of transfer protocols (e.g., frame relay, internes protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium capable of storing, encoding or carrying instructions for execution by the machine 1000, and includes digital or analog communications signals or other intangible medium to facilitate communication of such software.

To better illustrate the methods and apparatuses described herein, a non-limiting set of Example embodiments are set forth below as numerically identified Examples.

Example 1 is a memory device, comprising: a memory storage region; a host interface; and a controller having a processor configured to execute instructions stored on the memory device, wherein the instructions, when executed by the processor, cause the processor to perform operations, comprising: in response to receiving a write command and associated data through the host interface: identify a temperature metric applicable to at least a region of the memory device, wherein the temperature metric is selected from at least three possible temperature metrics; identify a program-erase (P/E) cycle metric associated with a number of program-erase cycles performed by the memory device within a selected time interval; select a memory trim set from multiple candidate memory trim sets based on the temperature metric and the P/E cycle metric, the multiple candidate memory trim sets including multiple respective memory trim values for write operation parameters; and write the data into the memory storage region in accordance with the write command using the memory trim values of the selected memory trim set for write operation parameters.

In Example 2, the subject matter of Example 1 includes, wherein the temperature metric is identified using a first plurality of status bits, and wherein the first plurality of status bits is indicative of a temperature range of multiple temperature ranges and is associated with a temperature applicable to the region of the memory device.

In Example 3, the subject matter of Example 2 includes, wherein the multiple temperature ranges include the following: a cold temperature range associated with a temperature range between a first threshold temperature value and a second threshold temperature value; a normal temperature range associated with a temperature range between the second threshold temperature value and a third threshold temperature value; and a hot temperature range associated with a temperature range between the third threshold temperature value and a fourth threshold temperature value.

In Example 4, the subject matter of Examples 2-3 includes, wherein the P/E cycle metric is identified using a second plurality of status bits, the second plurality of status bits indicative of a P/E cycle range for the number of program-erase cycles performed by the memory device within the selected time interval.

In Example 5, the subject matter of Example 4 includes, wherein the P/E cycle range includes one of the following P/E cycle ranges: a first P/E cycle range with the number of P/E cycles performed by the memory device ranging between a first threshold number of P/E cycles and a second threshold number of P/E cycles; a second P/E cycle range with the number of P/E cycles performed by the memory device ranging between the second threshold number of P/E cycles and a third threshold number of P/E cycles; and a third P/E cycle range with the number of P/E cycles performed by the memory device ranging between the third threshold number of P/E cycles and a fourth threshold number of P/E cycles.

In Example 6, the subject matter of Example 5 includes, wherein a number of the multiple temperature ranges and a number of the P/E cycle ranges are configured at manufacturing time of the memory device.

In Example 7, the subject matter of Examples 5-6 includes, wherein a number of the multiple temperature ranges and a number of the P/E cycle ranges are configured after the memory device is powered up.

In Example 8, the subject matter of Examples 1-7 includes, wherein the instructions, when executed by the processor, cause the processor to perform operations, comprising: detect a current temperature applicable to the region of the memory device; identify a temperature range of at least three temperature ranges within which the current temperature falls; and select the memory trim set from the multiple candidate memory trim sets based on the identified temperature range and the P/E cycle metric.

In Example 9, the subject matter of Examples 1-8 includes, wherein the multiple respective memory trim values include a temperature coefficient value.

In Example 10, the subject matter of Example 9 includes, wherein the multiple respective memory trim values include threshold voltage distributions for data writes, the threshold voltage distributions corresponding to the temperature coefficient value.

In Example 11, the subject matter of Examples 1-10 includes, wherein the multiple respective memory trim values include a program voltage step size of the memory device.

In Example 12, the subject matter of Examples 1-11 includes, wherein the multiple respective memory trim values include a program pulse width for writing to the memory device.

In Example 13, the subject matter of Examples 1-12 includes, wherein the multiple respective memory trim values include one or more program verify voltage levels.

In Example 14, the subject matter of Examples 1-13 includes, wherein the memory device is a Universal Flash Storage (UFS) device, an embedded Multimedia Card (eMMC) device, or a Solid-State Drive (SSD) device.

In Example 15, the subject matter of Examples 1-14 includes, wherein the memory device comprises one or more flash memory die.

In Example 16, the subject matter of Examples 1-15 includes, wherein the memory storage region includes a flash memory array, the flash memory array including a number of blocks of memory cells organized into a number of physical pages.

In Example 17, the subject matter of Example 16 includes, wherein the flash memory array includes NAND flash memory cells.

In Example 18, the subject matter of Examples 16-17 includes, wherein the region of the memory device is an entirety of the memory device.

In Example 19, the subject matter of Examples 16-18 includes, wherein the region of the memory device is an individual memory die including the memory storage region.

In Example 20, the subject matter of Examples 16-19 includes, wherein the region of the memory device is a region including one or more of the memory cells, one or more of the blocks, one or more of the physical pages, or a combination thereof.

Example 21 is a method, comprising: receiving at a memory device, a write command and associated data through a host interface; identifying a temperature metric applicable to at least a region of the memory device, wherein the temperature metric is selected from at least three possible temperature metrics; identifying a program-erase (P/E) cycle metric associated with a number of program-erase cycles performed by the memory device within a selected time interval; selecting a memory trim set from multiple candidate memory trim sets based on the temperature metric and the P/E cycle metric, the multiple candidate memory trim sets including multiple respective memory trim values for write operation parameters; and writing the data into the memory storage region in accordance with the write command using the memory trim values of the selected memory trim set for write operation parameters.

In Example 22, the subject matter of Example 21 includes, wherein the temperature metric is identified using a first plurality of status bits, and wherein the first plurality of status bits is indicative of a temperature range of multiple temperature ranges and is associated with a temperature applicable to the region of the memory device.

In Example 23, the subject matter of Example 22 includes, wherein the multiple temperature ranges include the following: a cold temperature range associated with a temperature range between a first threshold temperature value and a second threshold temperature value; a normal temperature range associated with a temperature range between the second threshold temperature value and a third threshold temperature value; and a hot temperature range associated with a temperature range between the third threshold temperature value and a fourth threshold temperature value.

In Example 24, the subject matter of Examples 22-23 includes, wherein the P/E cycle metric is identified using a second plurality of status bits, the second plurality of status bits indicative of a P/E cycle range for the number of program-erase cycles performed by the memory device within the selected time interval.

In Example 25, the subject matter of Example 24 includes, wherein the P/E cycle range includes one of the following P/E cycle ranges: a first P/E cycle range with the number of P/E cycles performed by the memory device ranging between a first threshold number of P/E cycles and a second threshold number of P/E cycles; a second P/E cycle range with the number of P/E cycles performed by the memory device ranging between the second threshold number of P/E cycles and a third threshold number of P/E cycles; and a third P/E cycle range with the number of P/E cycles performed by the memory device ranging between the third threshold number of P/E cycles and a fourth threshold number of P/E cycles.

In Example 26, the subject matter of Example 25 includes, wherein a number of the multiple temperature ranges and a number of the P/E cycle ranges are configured at manufacturing time of the memory device.

In Example 27, the subject matter of Examples 25-26 includes, wherein a number of the multiple temperature ranges and a number of the P/E cycle ranges are configured after the memory device is powered up.

In Example 28, the subject matter of Examples 21-27 includes, detecting a current temperature applicable to the region of the memory device; identifying a temperature range of at least three temperature ranges within which the current temperature falls; and selecting the memory trim set from the multiple candidate memory trim sets based on the identified temperature range and the P/E cycle metric.

In Example 29, the subject matter of Examples 21-28 includes, wherein the multiple respective memory trim values include a temperature coefficient value.

In Example 30, the subject matter of Example 29 includes, wherein the multiple respective memory trim values include threshold voltage distributions for data writes, the threshold voltage distributions corresponding to the temperature coefficient value.

In Example 31, the subject matter of Examples 21-30 includes, wherein the multiple respective memory trim values include a program voltage step size of the memory device.

In Example 32, the subject matter of Examples 21-31 includes, wherein the multiple respective memory trim values include a program pulse width for writing to the memory device.

In Example 33, the subject matter of Examples 21-32 includes, wherein the multiple respective memory trim values include one or more program verify voltage levels.

In Example 34, the subject matter of Examples 21-33 includes, wherein the memory device is a Universal Flash Storage (UFS) device, an embedded Multimedia Card (eMMC) device, or a Solid-State Drive (SSD) device.

In Example 35, the subject matter of Examples 21-34 includes, wherein the memory device comprises one or more flash memory die.

In Example 36, the subject matter of Examples 21-35 includes, wherein the memory storage region includes a flash memory array, the flash memory array including a number of blocks of memory cells organized into a number of physical pages.

In Example 37, the subject matter of Example 36 includes, wherein the flash memory array includes NAND flash memory cells.

In Example 38, the subject matter of Examples 36-37 includes, wherein the region of the memory device is an entirety of the memory device.

In Example 39, the subject matter of Examples 36-38 includes, wherein the region of the memory device is an individual memory die including the memory storage region.

In Example 40, the subject matter of Examples 36-39 includes, wherein the region of the memory device is a region including one or more of the memory cells, one or more of the blocks, one or more of the physical pages, or a combination thereof.

Example 41 is a machine-readable medium, comprising instructions, which when executed by a processor of a memory device, cause the processor to perform operations comprising: receiving at the memory device, a write command and associated data through a host interface; identifying a temperature metric applicable to at least a region of the memory device, wherein the temperature metric is selected from at least three possible temperature metrics; identifying a program-erase (P/E) cycle metric associated with a number of program-erase cycles performed by the memory device within a selected time interval; selecting a memory trim set from multiple candidate memory trim sets based on the temperature metric and the P/E cycle metric, the multiple candidate memory trim sets including multiple respective memory trim values for write operation parameters; and write the data into the memory storage region in accordance with the write command using the memory trim values of the selected memory trim set for write operation parameters.

In Example 42, the subject matter of Example 41 includes, wherein the temperature metric is identified using a first plurality of status bits, and wherein the first plurality of status bits is indicative of a temperature range of multiple temperature ranges and is associated with a temperature applicable to the region of the memory device.

In Example 43, the subject matter of Example 42 includes, wherein the multiple temperature ranges include the following: a cold temperature range associated with a temperature range between a first threshold temperature value and a second threshold temperature value; a normal temperature range associated with a temperature range between the second threshold temperature value and a third threshold temperature value; and a hot temperature range associated with a temperature range between the third threshold temperature value and a fourth threshold temperature value.

In Example 44, the subject matter of Examples 42-43 includes, wherein the P/E cycle metric is identified using a second plurality of status bits, the second plurality of status bits indicative of a P/E cycle range for the number of program-erase cycles performed by the memory device within the selected time interval.

In Example 45, the subject matter of Example 44 includes, wherein the P/E cycle range includes one of the following P/E cycle ranges: a first P/E cycle range with the number of P/E cycles performed by the memory device ranging between a first threshold number of P/E cycles and a second threshold number of P/E cycles; a second P/E cycle range with the number of P/E cycles performed by the memory device ranging between the second threshold number of P/E cycles and a third threshold number of P/E cycles; and a third P/E cycle range with the number of P/E cycles performed by the memory device ranging between the third threshold number of P/E cycles and a fourth threshold number of P/E cycles.

In Example 46, the subject matter of Example 45 includes, wherein a number of the multiple temperature ranges and a number of the P/E cycle ranges are configured at manufacturing time of the memory device.

In Example 47, the subject matter of Examples 45-46 includes, wherein a number of the multiple temperature ranges and a number of the P/E cycle ranges are configured after the memory device is powered up.

In Example 48, the subject matter of Examples 41-47 includes, wherein the processor further performs operations comprising: detecting a current temperature applicable to the region of the memory device; identifying a temperature range of at least three temperature ranges within which the current temperature falls; and selecting the memory trim set from the multiple candidate memory trim sets based on the identified temperature range and the P/E cycle metric.

Example 49 is a system, comprising: means for receiving at a memory device, a write command and associated data; means for identifying a temperature metric applicable to at least a region of the memory device, wherein the temperature metric is selected from at least three possible temperature metrics; means for identifying a program-erase (P/E) cycle metric associated with a number of program-erase cycles performed by the memory device within a selected time interval; means for selecting a memory trim set from multiple candidate memory trim sets based on the temperature metric and the P/E cycle metric, the multiple candidate memory trim sets including multiple respective memory trim values for write operation parameters; and means for writing the data into the memory storage region in accordance with the write command using the memory trim values of the selected memory trim set for write operation parameters.

In Example 50, the subject matter of Example 49 includes, wherein the temperature metric is identified using a first plurality of status bits, and wherein the first plurality of status bits is indicative of a temperature range of multiple temperature ranges and is associated with a temperature applicable to the region of the memory device.

In Example 51, the subject matter of Example 50 includes, wherein the multiple temperature ranges include the following: a cold temperature range associated with a temperature range between a first threshold temperature value and a second threshold temperature value; a normal temperature range associated with a temperature range between the second threshold temperature value and a third threshold temperature value; and a hot temperature range associated with a temperature range between the third threshold temperature value and a fourth threshold temperature value.

In Example 52, the subject matter of Examples 50-51 includes, wherein the P/E cycle metric is identified using a second plurality of status bits, the second plurality of status bits indicative of a P/E cycle range for the number of program-erase cycles performed by the memory device within the selected time interval.

In Example 53, the subject matter of Example 52 includes, wherein the P/E cycle range includes one of the following P/E cycle ranges: a first P/E cycle range with the number of P/E cycles performed by the memory device ranging between a first threshold number of P/E cycles and a second threshold number of P/E cycles; a second P/E cycle range with the number of P/E cycles performed by the memory device ranging between the second threshold number of P/E cycles and a third threshold number of P/E cycles; and a third P/E cycle range with the number of P/E cycles performed by the memory device ranging between the third threshold number of P/E cycles and a fourth threshold number of P/E cycles.

In Example 54, the subject matter of Example 53 includes, wherein a number of the multiple temperature ranges and a number of the P/E cycle ranges are configured at manufacturing time of the memory device.

In Example 55, the subject matter of Examples 53-54 includes, wherein a number of the multiple temperature ranges and a number of the P/E cycle ranges are configured after the memory device is powered up.

In Example 56, the subject matter of Examples 49-55 includes, means for detecting a current temperature applicable to the region of the memory device; means for identifying a temperature range of at least three temperature ranges within which the current temperature falls; and means for selecting the memory trim set from the multiple candidate memory trim sets based on the identified temperature range and the P/E cycle metric.

Example 57 is at least one machine-readable medium including instructions that, when executed by processing circuitry, cause the processing circuitry to perform operations to implement of any of Examples 1-56.

Example 58 is an apparatus comprising means to implement of any of Examples 1-56.

Example 59 is a system to implement of any of Examples 1-56.

Example 60 is a method to implement of any of Examples 1-56.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, i.e., a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to," or "directly coupled with" another element, there are no intervening elements or layers present. If two elements are shown in the drawings with a line connecting them, the two elements can either be coupled or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., CDs and DVDs), magnetic cassettes, memory cards or sticks, RAMs, ROMs, SSDs, UFS devices, eMMC devices, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the present disclosure should be determined with reference to the appended claims, along with the full scope of equivalents to which such claims are entitled.

The invention claimed is:

1. A memory device, comprising:
   a memory storage region;
   a host interface; and
   a controller having a processor configured to execute instructions stored on the memory device, wherein the instructions, when executed by the processor, cause the processor to perform operations, comprising:
   in response to receiving a write command and associated data through the host interface:
   identify a temperature metric applicable to at least a region of the memory device, wherein the temperature metric is selected from at least three possible temperature metrics and wherein the temperature metric includes a temperature value and wherein the temperature metric is identified using a first plurality of status bits included as a part of the respective temperature metric separate from the temperature value, the first plurality of status bits indicative of a temperature range and the first plurality of status bits being associated with a temperature applicable to the region of the memory device;
   identify a program-erase (P/E) cycle metric associated with a number of program-erase cycles performed by the memory device within a selected time interval, wherein the P/E cycle metric is identified from a plurality of P/E cycle ranges and wherein the P/E cycle metric is identified using a second plurality of status bits;
   select a memory trim set from multiple candidate memory trim sets based on the temperature metric and the P/E cycle metric, the multiple candidate memory trim sets including multiple respective memory trim values for write operation parameters; and
   write the data into the memory storage region in accordance with the write command using the memory trim values of the selected memory trim set for write operation parameters.

2. The memory device of claim 1, wherein the multiple temperature ranges include the following:
   a cold temperature range associated with a temperature range between a first threshold temperature value and a second threshold temperature value;

a normal temperature range associated with a temperature range between the second threshold temperature value and a third threshold temperature value; and a hot temperature range associated with a temperature range between the third threshold temperature value and a fourth threshold temperature value.

3. The memory device of claim 1, wherein the second plurality of status bits is indicative of a P/E cycle range of the plurality of P/E cycle ranges, and the P/E cycle range is indicative of the number of program-erase cycles performed by the memory device within the selected time interval.

4. The memory device of claim 1, wherein the instructions, when executed by the processor, cause the processor to perform operations, comprising:

detecting a current temperature applicable to the region of the memory device;

identifying a temperature range of at least three temperature ranges within which the current temperature falls; and selecting the memory trim set from the multiple candidate memory trim sets based on the identified temperature range and the P/E cycle metric.

5. The memory device of claim 1, wherein the multiple respective memory trim values include a temperature coefficient value.

6. The memory device of claim 5, wherein the multiple respective memory trim values include threshold voltage distributions for data writes, the threshold voltage distributions corresponding to the temperature coefficient value.

7. The memory device of claim 1, wherein the multiple respective memory trim values include a program voltage step size of the memory device.

8. The memory device of claim 1, wherein the multiple respective memory trim values include a program pulse width for writing to the memory device.

9. The memory device of claim 1, wherein the multiple respective memory trim values include one or more program verify voltage levels.

10. The memory device of claim 1, wherein the memory storage region includes a NAND flash memory array, the NAND flash memory array including a number of blocks of memory cells organized into a number of physical pages.

11. The memory device of claim 10, wherein the region of the memory device is a region including one or more of the memory cells, one or more of the blocks, one or more of the physical pages, or a combination thereof.

12. A memory device, comprising:
a memory storage region;
a host interface; and
a controller having a processor configured to execute instructions stored on the memory device, wherein the instructions, when executed by the processor, cause the processor to perform operations, comprising:
in response to receiving a write command and associated data through the host interface:
identify a temperature metric applicable to at least a region of the memory device, wherein the temperature metric is selected from at least three possible temperature metrics;
identify a program-erase (P/E) cycle metric associated with a number of program-erase cycles performed by the memory device within a selected time interval;
select a memory trim set from multiple candidate memory trim sets based on the temperature metric and the P/E cycle metric, the multiple candidate memory trim sets including multiple respective memory trim values for write operation parameters; and write the data into the memory storage region in accordance with the write command using the memory trim values of the selected memory trim set for write operation parameters;

wherein the temperature metric includes a temperature value and wherein the temperature metric is identified using a first plurality of status bits included as a part of the respective temperature metric separate from the temperature value, wherein the first plurality of status bits is indicative of a temperature range of multiple temperature ranges and is associated with a temperature applicable to the region of the memory device, wherein the P/E cycle metric is identified using a second plurality of status bits, the second plurality of status bits indicative of a P/E cycle range for the number of program-erase cycles performed by the memory device within the selected time interval, and wherein the P/E cycle range includes one of the following P/E cycle ranges:

a first P/E cycle range with the number of P/E cycles performed by the memory device ranging between a first threshold number of P/E cycles and a second threshold number of P/E cycles;

a second P/E cycle range with the number of P/E cycles performed by the memory device ranging between the second threshold number of P/E cycles and a third threshold number of P/E cycles; and a third P/E cycle range with the number of P/E cycles performed by the memory device ranging between the third threshold number of P/E cycles and a fourth threshold number of P/E cycles.

13. The memory device of claim 12, wherein a number of the multiple temperature ranges and a number of the P/E cycle ranges are configured at manufacturing time of the memory device.

14. The memory device of claim 12, wherein a number of the multiple temperature ranges and a number of the P/E cycle ranges are configured after the memory device is powered up.

15. A method, comprising:
receiving at a memory device, a write command and associated data through a host interface;
identifying a temperature metric applicable to at least a memory storage region of the memory device, wherein the temperature metric is selected from at least three possible temperature metrics and wherein the temperature metric includes a temperature value and wherein the temperature metric is identified using a first plurality of status bits included as a part of the respective temperature metric separate from the temperature value, the first plurality of status bits indicative of a temperature range and the first plurality of status bits being associated with a temperature applicable to the memory storage region of the memory device;
identifying a program-erase (P/E) cycle metric associated with a number of program-erase cycles performed by the memory device within a selected time interval, wherein the P/E cycle metric is identified from a plurality of P/E cycle ranges and wherein the P/E cycle metric is identified using a second plurality of status bits;
selecting a memory trim set from multiple candidate memory trim sets based on the temperature metric and the P/E cycle metric, the multiple candidate memory trim sets including multiple respective memory trim values for write operation parameters; and write the data into the memory storage region in accordance with the write command using the memory trim values of the selected memory trim set for write operation parameters.

16. The method of claim 15, wherein the multiple temperature ranges include the following:
a cold temperature range associated with a temperature range between a first threshold temperature value and a second threshold temperature value;
a normal temperature range associated with a temperature range between the second threshold temperature value and a third threshold temperature value; and
a hot temperature range associated with a temperature range between the third threshold temperature value and a fourth threshold temperature value.

17. The method of claim 15, further comprising:
detecting a current temperature applicable to the region of the memory device;
identifying a temperature range of at least three temperature ranges within which the current temperature falls; and
selecting the memory trim set from the multiple candidate memory trim sets based on the identified temperature range and the P/E cycle metric.

18. A non-transitory machine-readable medium, comprising instructions, which when executed by a processor of a memory device, cause the processor to perform operations comprising:
in response to receiving at the memory device, a write command and associated data through a host interface:
identifying a temperature metric applicable to at least a memory storage region of the memory device, wherein the temperature metric is selected from at least three possible temperature metrics and wherein the temperature metric includes a temperature value and wherein the temperature metric is identified using a first plurality of status bits included as a part of the respective temperature metric separate from the temperature value, the first plurality of status bits indicative of a temperature range and the first plurality of status bits being associated with a temperature applicable to the memory storage region of the memory device;
identifying a program-erase (P/E) cycle metric associated with a number of program-erase cycles performed by the memory device within a selected time interval, wherein the P/E cycle metric is identified from a plurality of P/E cycle ranges and wherein the P/E cycle metric is identified using a second plurality of status bits;
selecting a memory trim set from multiple candidate memory trim sets based on the temperature metric and the P/E cycle metric, the multiple candidate memory trim sets including multiple respective memory trim values for write operation parameters; and
write the data into the memory storage region in accordance with the write command using the memory trim values of the selected memory trim set for write operation parameters.

* * * * *